United States Patent [19]
Nightingale

[11] Patent Number: 5,387,872
[45] Date of Patent: Feb. 7, 1995

[54] POSITIONING AID FOR A HAND-HELD ELECTRICAL TEST PROBE

[75] Inventor: Mark W. Nightingale, Washougal, Wash.

[73] Assignee: Tektronix, Inc., Wilsonville, Oreg.

[21] Appl. No.: 86,698

[22] Filed: Jul. 2, 1993

[51] Int. Cl.6 ............................................. G01R 1/04
[52] U.S. Cl. .................................... 324/538; 439/482
[58] Field of Search ............... 324/158 P, 158 F, 538, 324/72.5; 439/482, 912.1

[56] References Cited

U.S. PATENT DOCUMENTS

| | | | |
|---|---|---|---|
| 4,065,717 | 12/1977 | Kattner et al. | 324/158 P |
| 4,112,363 | 9/1978 | Morrison et al. | 324/72.5 |
| 4,671,590 | 6/1987 | Iguasiak | 439/266 |
| 4,767,985 | 8/1988 | Shearer et al. | 324/158 P |
| 4,949,032 | 8/1990 | Yergenson et al. | 324/158 P |
| 5,015,946 | 5/1991 | Janko | 324/158 P |
| 5,202,622 | 4/1993 | Cole et al. | 324/158 F |

Primary Examiner—Kenneth A. Wieder
Assistant Examiner—Barry C. Bowser
Attorney, Agent, or Firm—William K. Bucher

[57] ABSTRACT

An apparatus for directly positioning a hand-held electrical test probe onto leads of a surface mounted integrated circuit, IC, device has a housing with a central bore therethrough for receiving the probing tip of the test probe, which is coupled to compensation circuitry in the probing head. One end of the housing which is normal to the central bore has at least four teeth extending therefrom defining slots for engaging the leads of the IC. The central bore is exposed in the central slot of the housing for exposing the probing tip therein for providing an electrical connection between one of the leads on the IC and the electrical circuitry of the probing head.

4 Claims, 2 Drawing Sheets

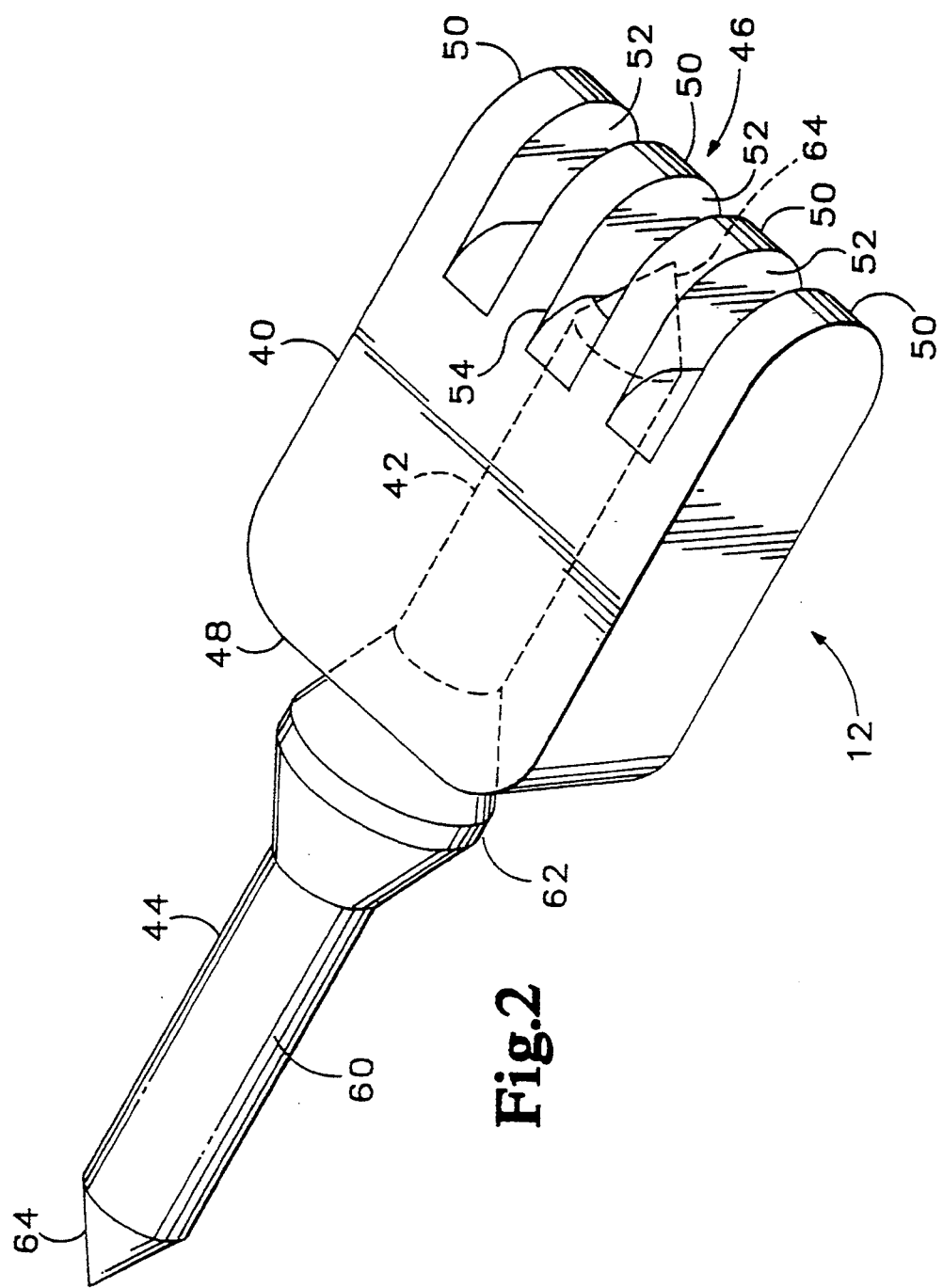

POSITIONING AID FOR A HAND-HELD ELECTRICAL TEST PROBE

BACKGROUND OF THE INVENTION

The present invention relates generally to electrical test probes and more particularly to an apparatus for positioning a hand-held electrical test probe on leads of an integrated circuit device mounted on a substrate.

Integrated circuit packages have evolved from the early days of dual in-line packages (DIP) having a limited number of leads with 100 mil spacing between the leads to today's surface mounted packages having tens or hundreds of leads with lead spacings of 50, 25, and 19.6 mils. In addition, package shapes are no longer confined to the DIP configuration. For example, microprocessor chips and ASIC devices come in a variety of rectangular shapes and sizes. Hand held probing of these fine lead pitch devices is very difficult. It is very easy to short two adjacent leads together with the probe when trying to make a measurement on a single lead.

U.S. Pat. No. 4,949,032 describes a probe for dual in-line packages that has a detachable gripping portion that includes an extensible claw for gripping the DIP on one side and dual prongs having an extended contact disposed therebetween for connecting to a lead to be probed on the other side. The extended contact is a fairly stiff gold plated rod that is connected to a contact stem having an exposed center conductor. The center conductor is surrounded by an insulating material which in turn is surrounded by an outer shield of stainless steel miniature tubing. The center conductor and the steel tubing are respectively connected to the center conductor and the outer shielding conductor of a coaxial cable connected to a measurement test instrument. The detachable portion also includes a finger grip and a thumb grip by which the thumb and forefinger of one hand can cause the extensible claw to move away from the prongs. A compression spring causes retraction of the extensible claw when the pressure of the thumb and forefinger is released, thus gripping the DIP between the claws and the prongs.

One of the drawbacks to the above described gripping device is that it is specifically designed for DIP devices. The extensible claw would have to be considerably lengthened in order to grip current surface mounted microprocessor and ASIC packages. This would require extending the length of the gripper, which in turn would require lengthening the contact stem. This, in turn, would further increase the inductive and capacitive loading on the lead being probed. The probe is described and shown as being directly connected to a coaxial cable without any intervening compensation circuitry. This configuration severely limits the bandwidth of the probe. To faithfully reproduce signals from a device under test over a wide range of frequencies, some form of compensation circuitry needs to be included in the probe head. The circuitry may be passive or active and is designed to minimize the capacitive and inductive loading at the probe tip. The lack of any compensation in the probe is a further drawback to this design.

U.S. Pat. No. 4,767,985 describes another type device for use on IC packages. The device has a unitary body having an overall shape and configuration that allow it to fit over the IC package. The unitary body has comb teeth on one end for orienting the body over the leads of the IC. The unitary body also has gripping means having hook end for securely fastening the probe device to the IC device. A sliding plate means having holes formed therein that are aligned with the leads of the IC is provided inward lateral pressure on the gripping means for causing the hook ends to grip underneath the IC device. The unitary body also has at least one threaded screw hole to allow a size 4-40 machine screw to pass therethrough to provide downward pressure on the sliding plate to maintain the hook ends in gripping contact with the IC device. The holes in the sliding plate accept spring loaded electrical contact probes for making contact with the leads of the IC device.

Similar types of adapters for surface mounted IC device are described in U.S. Pat. No. 5,015,946 and U.S. Pat. No. 5,202,622. Both patent describe adapters for probing surface mounted integrated circuit devices with the first referenced patent having a housing that has a skirt with alignment surfaces for mating with the IC package to provide initial alignment. An alignment plate is elastically mounted within the probe housing internal of the skirt. The alignment plate has serrations between pin holes with the pin holes corresponding to probe pins elastically mounted on the probe housing in a pattern matching the leads of the integrated circuit package. When the probe is pressed down over the integrated circuit package the alignment surfaces within the skirt align the probe to the package, and the serrations mesh with the leads to align the probe pins with the leads, the probe pins extending through the pin holes and maintaining positive contact due to the elastic mounting of the pins. A base plate having a central aperture with comblike teeth extending into the aperture may first be placed over the integrated circuit package with the teeth meshing with the leads to provide a surface to mate with the alignment surface within the skirt. The probe housing also has an integral connector section that provides access to the probe pins. The connector section may have a plurality of individual connectors or a plurality of flexible cable outlets, both of which are connected to a measurement test instrument, such as an oscilloscope, logic analyzer or the like.

The other referenced patent describes an test fixture for a surface mounted IC device having a test head assembly connected to an adapter having electrically conductive elements that couple the electrical signals on each of the leads of the IC device to individual test points on the test head assembly. The adapter has a housing positionable on the IC device with the electrically conductive runs being disposed in the housing and held in place by coverplates. Each electrically conductive element has one end that engages a lead on the IC device and another end that forms an electrical contact pad that is exposed on the top of the housing. The test head assembly has corresponding contact pads that mate with the contact pads of the electrically conductive elements. The test head assembly contact pads are electrically connected to corresponding test points.

The three above described devices have some common characteristics. They all have a structure or unitary body that is device dependent. That is the housing or unitary body is specifically designed to fit over a particular IC device having a particular size and shape. To accommodate the various sizes and shapes of today's IC packages requires a multitude of devices having dimensional characteristics that meet each particular IC package shape. Further, the unitary body design uses spring loaded electrical contact probes, such as the P2662A Series Probes along with sockets 52662A that are manufactured and sold by Pylon Company, Inc. These pogo pin type probes suffer from the same problem as the contact stem of the '032 patent in that there is no compensation circuitry in the probing tip. While the '946 patent describes the use of individual probing tips within the housing for each lead of the IC device, it does not address the problem of providing compensation close to the probe tip. The '622 patents allows the use of hand held electrical test probes for probing test points of the test head assembly. However, there is still an extended signal path between the leads of the IC and the test points.

What is needed is an apparatus that allows direct hand-held probing of individual leads of a surface mounted integrated circuit device having fine lead pitch spacing using a hand held electrical test probe. The apparatus should be simple and inexpensive to manufacture and use and should not be constrained by the packaging shape or size of the IC device.

SUMMARY OF THE INVENTION

Accordingly, the present invention an apparatus for directly positioning a hand-held electrical test probe on individual leads of an integrated circuit device mounted on a substrate. The probe has electrical circuitry disposed within a probing head that is coupled to a measurement test instrument for receiving electrical signals on the integrated circuit device leads. The apparatus includes a housing having a central bore for receiving an electrically conductive element coupled to the electrical circuitry in the probing head. One end of the housing that is normal to the central bore has at least four teeth extending therefrom defining interposing slots for engaging leads of the integrated circuit device with the central bore being exposed in the central slot. The electrically conductive element is exposed in the central slot for providing an electrical connection between one of the leads and the electrical circuitry in the probing head. The housing may be composed of transparent plastic material providing a view of the electrically conductive element within the housing with the electrically conductive element being the probing tip of the hand held electrical test probe.

The objects, advantages and novel features of the present invention are apparent from the following detailed description when read in conjunction with appended claims and attached drawings.

BRIEF DESCRIPTION OF THE DRAWINGS

FIG. 2 is a perspective view of the apparatus for positioning a hand-held electrical test probe according to the present invention.

DETAILED DESCRIPTION OF THE PREFERRED EMBODIMENT

Figure 1:
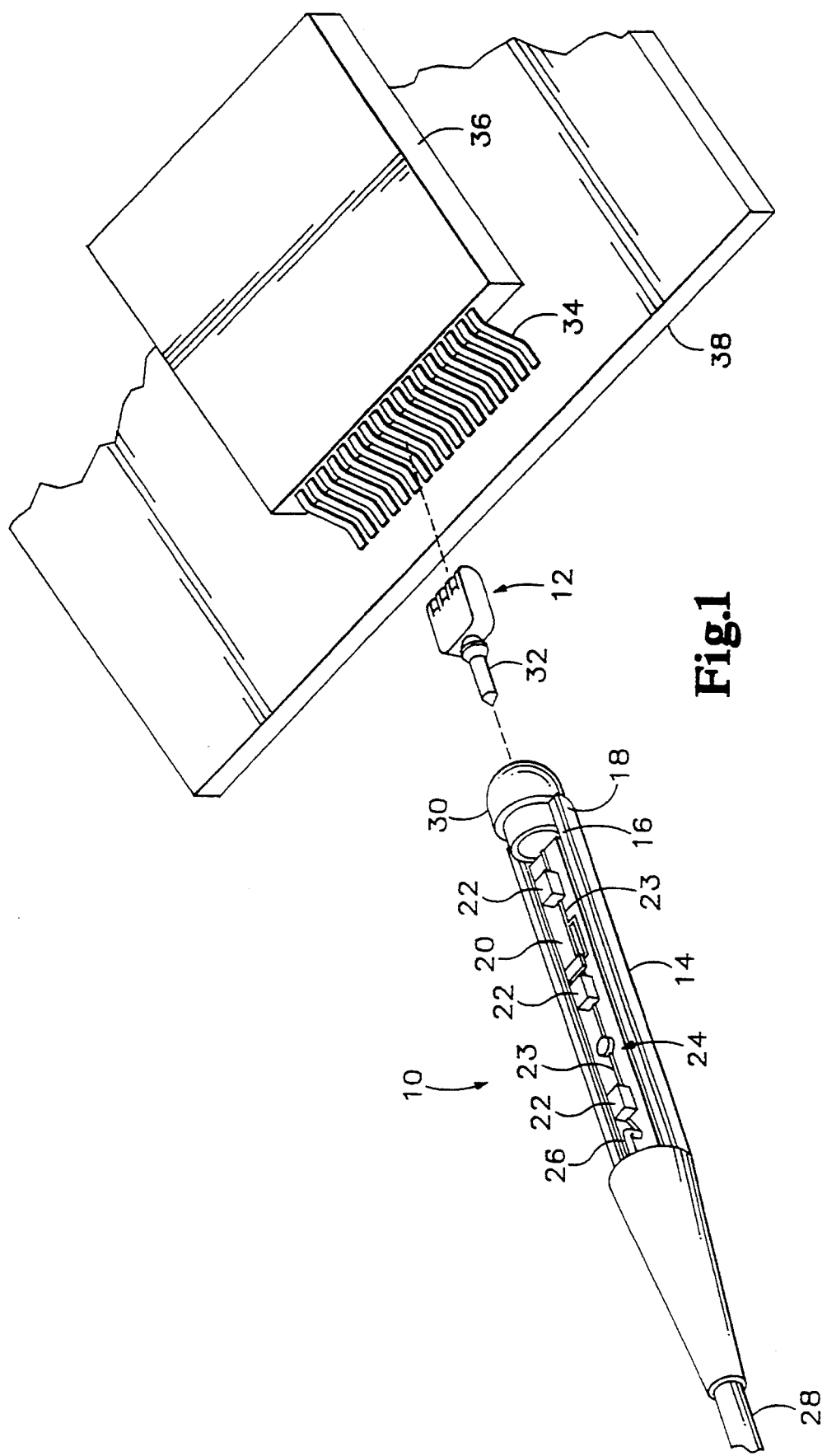
FIG. 1 is a partial cut-away perspective view of a hand-held electrical test probe with the apparatus for positioning the probe according to the present invention.

Referring to FIG. 1, there is shown a partial cut-away perspective view of a hand-held electrical test probe 10 and the positioning apparatus 12 of the present invention. The electrical test probe 10 has a probing head 14 having a tubular electrically conductive member 16 surrounded by an electrically insulating material 18, such as an injected molded plastic or the like. Disposed within the tubular member 16 is a substrate 20 having electrical components 22 and circuit runs 23 thereon forming electrical circuitry 24 for compensating the probe. The components 22 may be passive or active depending on the particular application for the probe. The circuitry 24 on substrate 20 is electrically coupled to a center conductor 26 of a resistive center cable or a coaxial cable 28 that extends from one end of the probing head 14. The outer shielding conductor of the cable (not shown) is electrically connected to the tubular member 16 and the substrate 20 for providing an electrical ground for the probing head 14. The other end of the probing head 14 has a insulating plug 30 extending from the end of the tubular body 16. Centrally disposed within the insulating plug 30 is a probing tip 32, which is coupled to the electrical circuity 24 on the substrate 20. The positioning apparatus 12 is placed on the probing tip 32 allowing the hand-held electrical test probe 10 probe to probe individual leads 34 of an integrated circuit device 36 surface mounted on a substrate 38.

Referring to FIG. 2 there is shown a perspective view of the positioning apparatus 12 of the present invention. The apparatus 12 has a housing 40 having a centrally disposed bore 42 therethrough. The bore 42 receives an electrically conductive element 44, which in the preferred embodiment is the probing tip 32. The housing 40 is approximately rectangular in shape and has a front and back surface 46 and 48 normal to the central bore 42. The housing 40 is formed of a commonly used polycarbonate material, which in the preferred embodiment is brightly color and transparent. Making the housing of a brightly colored and transparent material allows the electrically conductive element 44 to be seen in the housing, which is an aid in positioning the element on the selected lead of the IC. The front surface 46 of the housing 40 has at least four evenly spaced teeth 50 extending therefrom defining three evenly spaced interposing slots 52. Since the apparatus is designed for probing surface mounted IC devices 36 having very fine lead pitch spacing, such as 25 or 19.6 mils, any fewer than four teeth would produce a positioning aid that would not be durable enough for everyday use. With a four tooth configuration, one of the slots 54 will be centrally disposed on the front surface 46 of the housing 40 and aligned with the centrally disposed bore 42 in the housing 40. The central bore 42 is exposed within the central slot 54 allowing the probing tip 32 to be exposed within the slot 54 for making electrical contact with a lead 34 on a surface mounted integrated circuit device 36.

In the preferred embodiment, the electrically conductive element 44 has a solid conductive shaft 60 formed from a conductive material, such as brass, beryllium/copper or the like. The solid conductive shaft may be plated with gold or other such highly conductive material to reduce oxidation build-up and improve conductivity. An outwardly extending symmetrical cone structure 62 is centrally disposed on the shaft 60. Both ends of the shaft 60 are tapered to form points 64 thus producing an element that is symmetrical on both ends about the cone structure 62. One end of the electrically conductive element 44 is disposed within the insulating plug 30 of probing head 14 and makes electrical contact with the electrical circuitry 24 on the substrate 20. The other end of the electrically conductive element 44 is disposed within the central bore 42 of the housing 40 and exposed within the central slot 54.

The positioning apparatus 12 of the present invention has been described as having a housing which, in the preferred embodiment, is formed from a brightly colored polycarbonate material. Alternately, the housing may be make of an opaque material. In this embodiment, tabs are formed on opposing surfaces of the housing that are aligned over the central bore as an aid in aligning the central slot 54 containing the exposed conductive element 44 onto the selected lead 34 of the integrated circuit device 36.

An apparatus for directly positioning a hand-held electrical test probe onto a lead of an integrated circuit device has been described having a housing with a centrally disposed bore therethrough for receiving an electrically conductive element. At least for teeth are formed on one surface of the housing the is normal to the central bore defining interposing slots for engaging leads of a surface mounted integrated circuit device. The electrically conductive element is exposed within the central slot for making electrical connection between a selected lead on the IC device and electrical circuitry in the hand-held electrical test probe. These and other aspects of the present invention are set forth in the appended claims.

What is claimed is:

1. An apparatus for directly positioning a hand-held electrical test probe on individual leads of an integrated circuit device mounted on a substrate with the probe having electrical circuitry disposed within a probing head that is coupled to a measurement test instrument for receiving electrical signals on the integrated circuit device leads comprising a housing having a central bore for receiving an electrical conductive element coupled to the electrical circuitry of the probe with one end of the housing being normal to the central bore and having at least four teeth extending therefrom defining interposing slots for engaging the leads of the integrated circuit device with the central bore being exposed within one of the slots for exposing the electrically conductive element therein for providing an electrical connection between one of the leads and the electrical circuitry of the probe head.

2. The apparatus as recited in claim 1 wherein the electrically conductive element has a solid conductive shaft having a centrally disposed outwardly extending symmetrical cone structure with both ends of the shaft being tapered to form points.

3. The apparatus as recited in claim 1 wherein the housing is composed of a transparent plastic material providing a view of the electrically conductive element within the housing.

4. The apparatus as recited in claim 1 wherein the electrically conductive element is a probing tip partially disposed within the probe head.

* * * * *